US012660601B2

(12) United States Patent　　(10) Patent No.:　US 12,660,601 B2
Neumann et al.　　(45) Date of Patent:　Jun. 16, 2026

(54) SEMICONDUCTOR DIE WITH A TUNGSTEN RUNNER AND A GATE RUNNER

(71) Applicant: Infineon Technologies Austria AG, Villach (AT)

(72) Inventors: Ingmar Neumann, Villach (AT); Adrian Finney, Villach (AT); Pascal Bierbaumer, Villach (AT); Laszlo Juhasz, Villach (AT)

(73) Assignee: Infineon Technologies Austria AG, Villach (AT)

( * ) Notice: Subject to any disclaimer, the term of this patent is extended or adjusted under 35 U.S.C. 154(b) by 768 days.

(21) Appl. No.: 17/871,260

(22) Filed: Jul. 22, 2022

(65) Prior Publication Data

US 2024/0030137 A1　　Jan. 25, 2024

(51) Int. Cl.
　　*H10W 20/41*　　(2026.01)
　　*H10D 30/66*　　(2025.01)
　　*H10D 64/00*　　(2025.01)
　　*H10W 20/44*　　(2026.01)
(52) U.S. Cl.
　　CPC ........ *H10W 20/427* (2026.01); *H10D 30/665* (2025.01); *H10D 30/668* (2025.01); *H10D 64/112* (2025.01); *H10D 64/117* (2025.01); *H10W 20/4441* (2026.01)
(58) Field of Classification Search
　　CPC ............. H01L 23/5286; H01L 23/5325; H01L 29/7811; H01L 29/7813; H10D 30/668; H10D 30/665; H10D 64/519; H10D 62/127
　　See application file for complete search history.

(56) References Cited

U.S. PATENT DOCUMENTS

| | | | | |
|---|---|---|---|---|
| 2009/0184373 A1* | 7/2009 | Kaindl | ................. | H10D 30/665 |
| | | | | 257/E21.294 |
| 2010/0140695 A1 | 6/2010 | Yedinak et al. | | |
| 2011/0233667 A1 | 9/2011 | Tai et al. | | |
| 2015/0311163 A1* | 10/2015 | Vogl | .................... | H10D 62/126 |
| | | | | 257/622 |
| 2019/0140084 A1* | 5/2019 | Shirakawa | .......... | H10D 64/231 |

(Continued)

FOREIGN PATENT DOCUMENTS

EP　　　3531457 A1　　8/2019

*Primary Examiner* — Lynne A Gurley
*Assistant Examiner* — Jonas T Beardsley
(74) *Attorney, Agent, or Firm* — Murphy, Bilak & Homiller, PLLC

(57)　　　　　ABSTRACT

A semiconductor die includes: a semiconductor substrate having an active region and an edge termination region that separates the active region from an edge of the semiconductor substrate; a plurality of transistor cells formed in the active region; a structured power metallization above the semiconductor substrate and including a gate pad and a gate runner that extends from the gate pad along one or more but not all sides of the semiconductor die above the edge termination region, the gate runner electrically connecting the gate pad to gate electrodes of the transistor cells; and a tungsten runner that follows the gate runner and contacts an underside of the gate runner. The tungsten runner is present above the edge termination region along each side of the semiconductor die that is at least partly devoid of the gate runner. A Method of producing the semiconductor die is also described.

24 Claims, 9 Drawing Sheets

(56)         References Cited

U.S. PATENT DOCUMENTS

| | | | |
|---|---|---|---|
| 2019/0267487 A1* | 8/2019 | Laforet | ................ H10D 30/668 |
| 2020/0373292 A1* | 11/2020 | Hoshi | .................. H10D 62/393 |
| 2022/0102549 A1 | 3/2022 | Weyers et al. | |
| 2022/0262909 A1* | 8/2022 | Lichtenwalner | ...... H01L 23/562 |

* cited by examiner

SEMICONDUCTOR DIE WITH A TUNGSTEN RUNNER AND A GATE RUNNER

BACKGROUND

Reducing the internal gate resistance of a power transistor device such as a power MOSFET (metal-oxide-semiconductor field-effect transistor) allows for a reduction of the gate runner that conducts the gate current and which is typically formed by an AlCu (aluminum copper)/W (tungsten) stripe along the sides of the device. Reducing the area of the gate runner is a space saving solution, which allows for an optimization of Ron*AA which is a figure of merit (FoM) based on the on-state resistance (Ron) and the active area (AA) of the device.

For semiconductor device voltage classes of 150V and higher, it becomes increasingly difficult to design a working edge termination capable of supporting the full drain-to-source voltage applied to the device. In these cases, the gate runner has an additional field plate effect in the off state, as the gate is grounded during the blocking (off) state. Therefore, removing even one side of the gate runner reduces the breakdown voltage of the power MOSFET.

Thus, there is a need for a gate runner design with improved Ron*AA without reducing breakdown voltage.

SUMMARY

According to an embodiment of a semiconductor die, the semiconductor die comprises: a semiconductor substrate comprising an active region and an edge termination region that separates the active region from an edge of the semiconductor substrate; a plurality of transistor cells formed in the active region; a structured power metallization above the semiconductor substrate and comprising a gate pad and a gate runner that extends from the gate pad along one or more but not all sides of the semiconductor die above the edge termination region, the gate runner electrically connecting the gate pad to gate electrodes of the transistor cells; and a tungsten runner that follows the gate runner and contacts an underside of the gate runner, wherein the tungsten runner is present above the edge termination region along each side of the semiconductor die that is at least partly devoid of the gate runner.

According to an embodiment of a method of producing a semiconductor die, the method comprises: forming a plurality of transistor cells formed in an active region of a semiconductor substrate that also comprises an edge termination region that separates the active region from an edge of the semiconductor substrate; forming a structured power metallization above the semiconductor substrate, the structured power metallization comprising a gate pad and a gate runner that extends from the gate pad along one or more but not all sides of the semiconductor die above the edge termination region, the gate runner electrically connecting the gate pad to gate electrodes of the transistor cells; and forming a tungsten runner that follows the gate runner and is in contact with an underside of the gate runner, wherein the tungsten runner is present above the edge termination region along each side of the semiconductor die that is at least partly devoid of the gate runner.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a gate runner design with improved Ron*AA without reducing breakdown voltage, where Ron*AA is a figure of merit based on the on-state resistance (Ron) and the active area (AA) of the device. The gate runner design includes a relatively thin tungsten runner that follows the relatively thick gate runner and contacts the underside of the gate runner. The tungsten runner is present above the edge termination region along each side of the semiconductor die that is at least partly devoid of the gate runner. For example, a U-shape gate layout may be used for improved Ron*AA while also serving as a field plate when the device is in the off state. Improvements are also introduced for the W gate finger comb structure at the side and in the corners of the edge termination, proving a more robust and symmetrical design.

Described next with reference to the figures are embodiments of the gate runner design and methods of producing the gate runner design.

Figure 1:
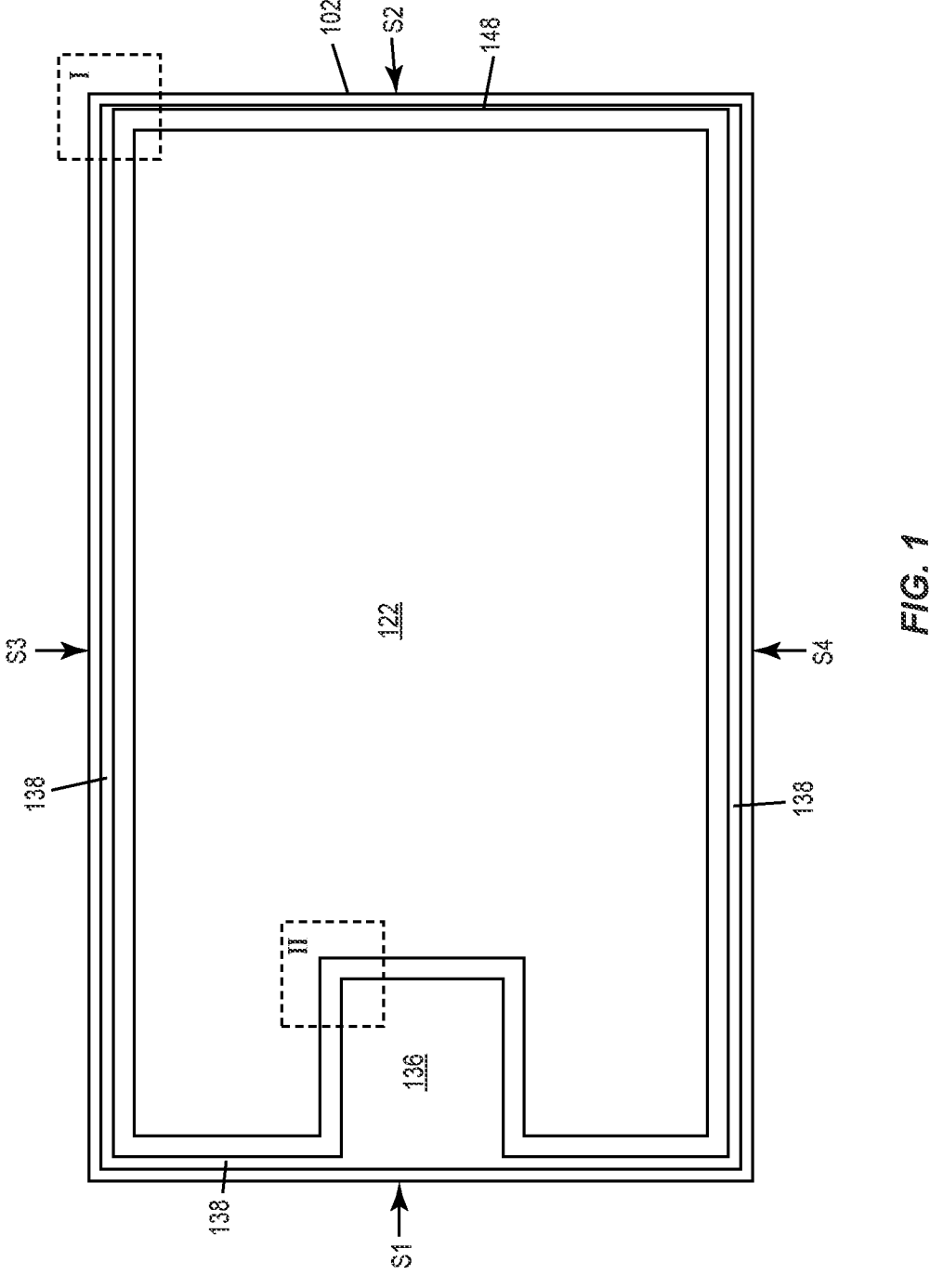
FIG. 1 illustrates a top plan view of an embodiment of a semiconductor die.
Figure 2:
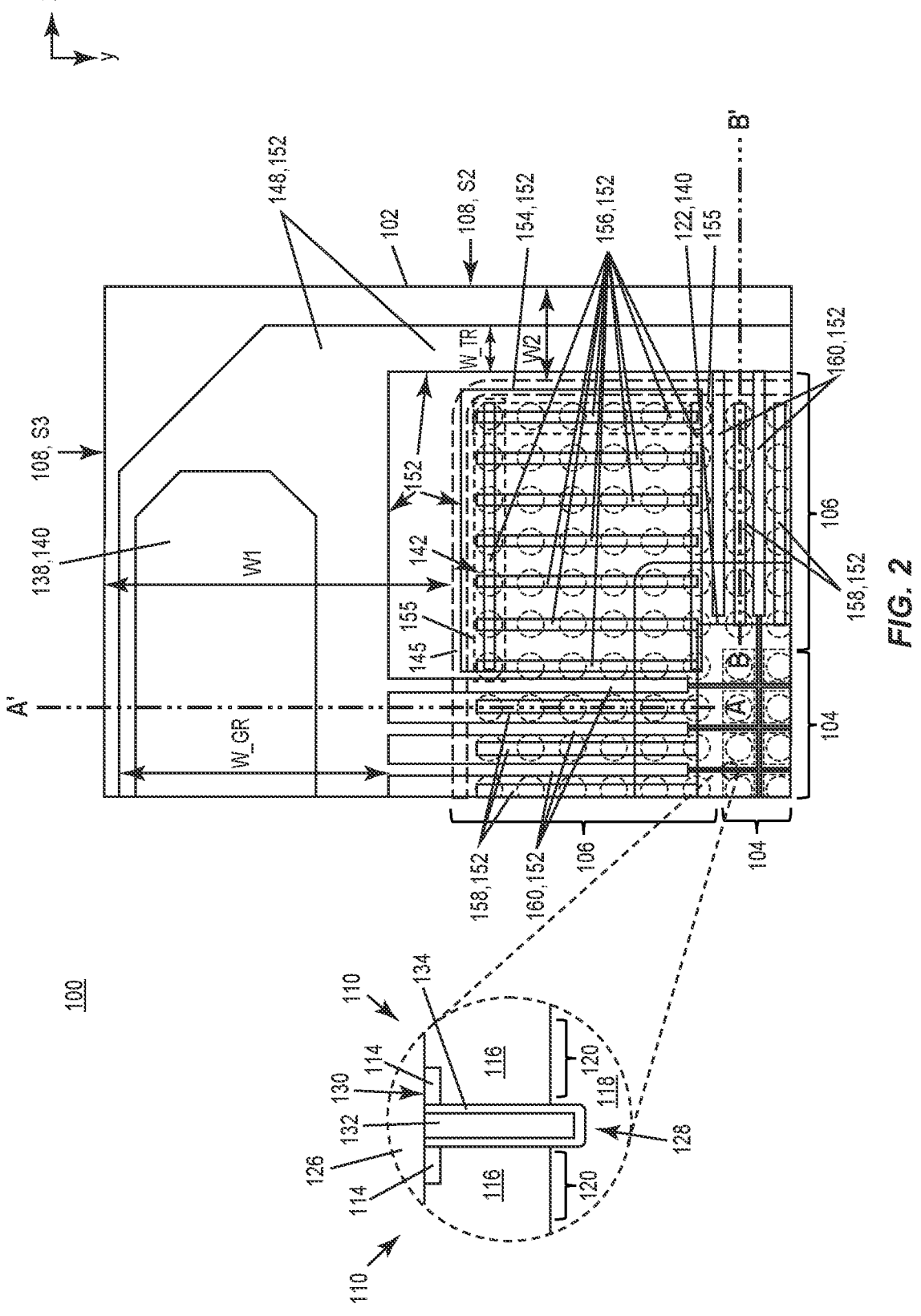
FIG. 2 illustrates a top plan view of an outer corner area of the semiconductor die indicated by the dashed square labeled I in FIG. 1.
Figure 3:
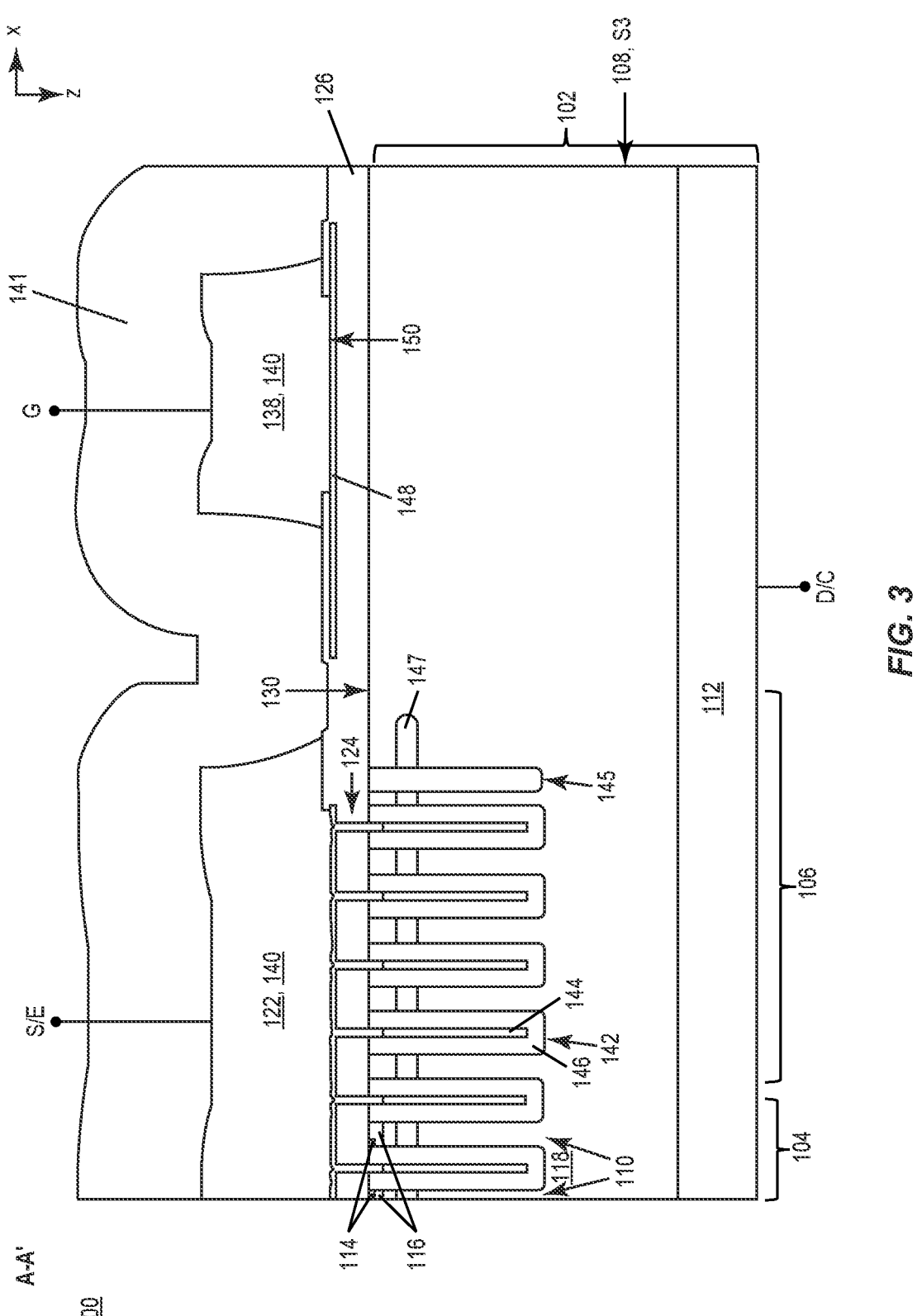
FIG. 3 illustrates a cross-sectional view of the outer corner area along the line labeled A-A' in FIG. 2.
Figure 4:
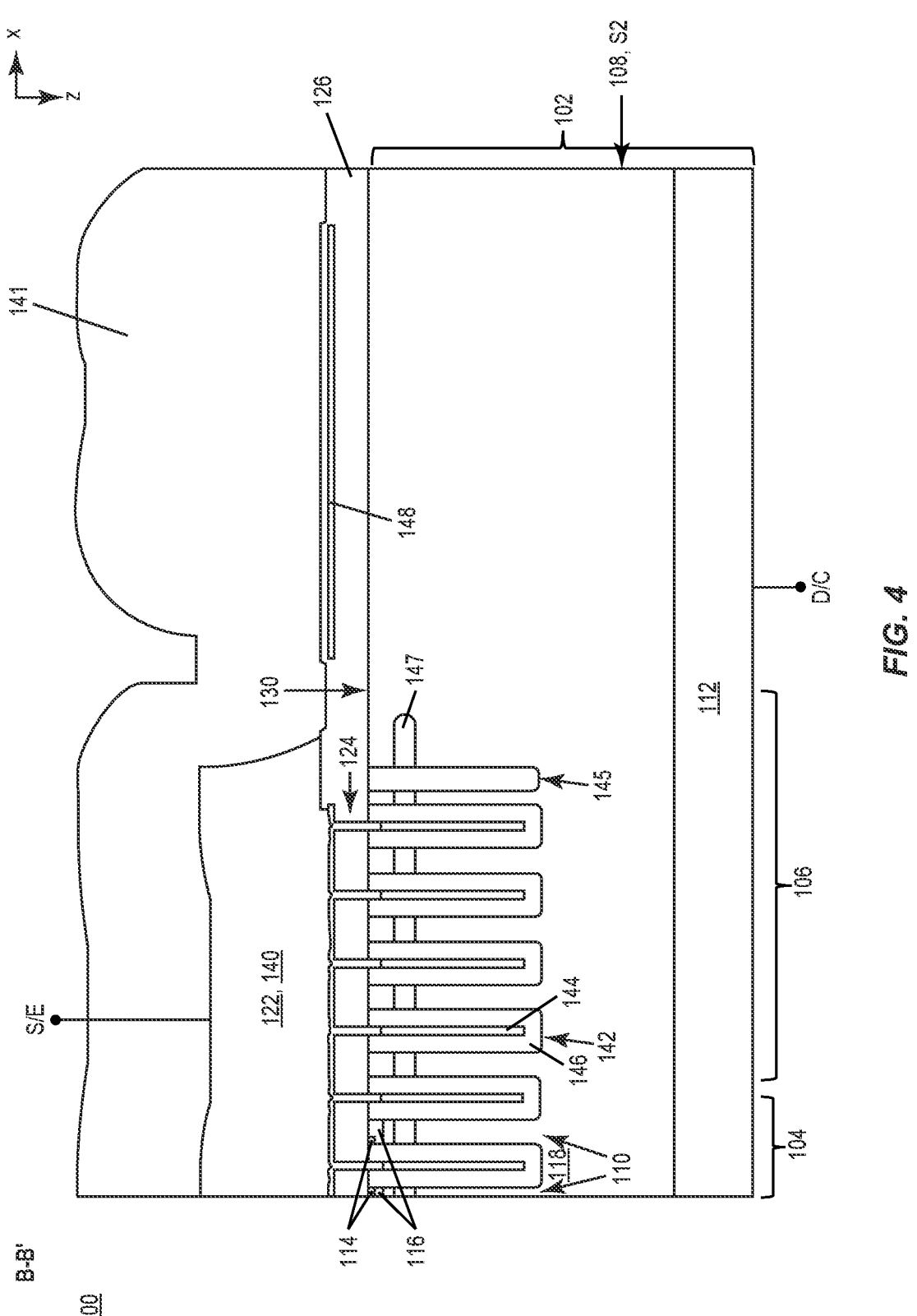
FIG. 4 illustrates a cross-sectional view of the outer corner area along the line labeled B-B' in FIG. 2.

FIG. 1 illustrates a top plan view of an embodiment of a semiconductor die 100. FIG. 2 illustrates a top plan view of the outer corner area of the semiconductor die 100 indicated by the dashed square labeled I in FIG. 1. FIG. 3 illustrates a cross-sectional view of the outer corner area along the line labeled A-A' in FIG. 2. FIG. 4 illustrates a cross-sectional view of the outer corner area along the line labeled B-B' in FIG. 2.

The semiconductor die 100 includes a semiconductor substrate 102. The semiconductor substrate 102 comprises one or more semiconductor materials that are used to form power semiconductor devices such as, e.g., Si or SiC power MOSFETs. For example, the semiconductor substrate 102 may comprise Si, silicon carbide (SiC), germanium (Ge), silicon germanium (SiGe), gallium nitride (GaN), gallium arsenide (GaAs), and the like. The semiconductor substrate 100 may include one or more epitaxial layers.

The semiconductor substrate 102 includes an active region 104 and an edge termination region 106 that separates the active region 104 from the edge 108 of the semiconductor substrate 102. The active region 104 is where fully functional device cells are formed. The edge termination region 106 is devoid of fully functional device cells and reduces electrical field crowding at termination.

Transistor cells 110 are formed in the active region 104. The transistor cells 110 are electrically coupled in parallel to form a vertical power transistor such as a vertical power MOSFET, an IGBT (insulated gate bipolar transistor), a JFET (junction FET), etc. Only a few transistor cells 110 are shown in the partial views of FIGS. 2 through 4. In general, the semiconductor die 100 may have tens, hundreds, thousands, or even more transistors cells 110. In an embodiment, the power transistor is a vertical device and has a breakdown of at least 150V in the edge termination region 106.

In the case of a vertical power transistor, a drain or collector 112 of the vertical power transistor is disposed at the backside of the semiconductor substrate 102. Each transistor cell 110 includes a source/emitter region 114 of a first conductivity type and a body region 116 of a second conductivity type opposite the first conductivity type. The source/emitter region 114 of each transistor cell 110 of the first type is separated from a drift zone 118 of the first conductivity type by the corresponding body region 116.

The first conductivity is n-type and the second conductivity type is p-type for an n-channel device formed by the transistor cells 110, whereas the first conductivity is p-type and the second conductivity type is n-type for a p-channel device formed by the transistor cells 110. For either an n-channel device or a p-channel device, the source/emitter region 114 and the body region 116 included in the same semiconductor mesa 120 form part of a transistor cell 110 and the transistor cells 110 are electrically connected in parallel between source (S)/emitter (E) and drain (D)/collector (C) terminals of the semiconductor device to form a power transistor.

The body regions 116 of the transistor cells 110 may include a body contact region (not shown) of the second conductivity type and having a higher doping concentration than the body regions 116, to provide an ohmic connection with a source/emitter metallization 122 through a contact structure 124 that extends through an interlayer dielectric 126 that separates the source/emitter metallization 122 from the semiconductor substrate 102. The source/emitter regions 114 of the transistor cells 110 are also electrically connected to the source/emitter metallization 122 through the contact structure 124.

Gate trenches 128 extend from a front surface 130 of the semiconductor substrate 102 and into the semiconductor substrate 102 in the active region 104 of the semiconductor substrate 102. The gate trenches 128 may be 'stripe-shaped' in that the gate trenches 128 have a longest linear dimension in the y direction in FIG. 2 and parallel to the front surface 130. In the case of a stripe shape, the gate trenches 128 delimit the semiconductor mesas 120 in the active region 104 of the semiconductor substrate 102.

Each gate trench 128 in the active region 104 of the semiconductor substrate 102 includes a gate electrode 132 and a gate dielectric insulating material 134 that separates the gate electrode 132 from the surrounding semiconductor material of the semiconductor substrate 102. The gate electrodes 128 in the active region 104 of the semiconductor substrate 102 are electrically connected to a gate terminal (G) through, e.g., a gate pad 136 and a gate runner 138 and respective contacts/vias (out of view) that extend through the interlayer dielectric 126. The gate pad 136 and the metal gate runner 138 may be formed in the same structured power metallization 140 as the source/emitter metallization 122. The structured power metallization 140 may comprise AlCu, e.g., and may be covered by a passivation 141.

Field plate trenches 142 extend from the front surface 130 of the semiconductor substrate 102 and into the semiconductor substrate 102 in both the active region 104 and the edge termination region 106 of the semiconductor substrate 102. Field plates 144 are disposed in the field plate trenches 142 and electrically connected to the source/emitter metallization 122 of the structured power metallization 140 through the contact structure 124. A field dielectric insulating material 146 separates the field electrodes 144 from the surrounding semiconductor material of the semiconductor substrate 102. The edge termination region 106 also may include an oxide trench 145. The oxide trench 145 is filled with a dielectric material and devoid of a field plate. The oxide trench 145 may be omitted for lower voltage classes, e.g., with a termination region breakdown voltage less than 150V. Separately or in combination, the edge termination region 106 may include a buried region 147 of the second conductivity type which may horizontally extend (x direction in FIGS. 3 and 4) into the active region 104 of the semiconductor substrate 102.

As explained above, the structured power metallization 140 formed above the semiconductor substrate 102 also includes the gate pad 136 and the gate runner 138. The gate runner 138 extends from the gate pad 136 along one or more but not all sides S1, S2, S3, S4 of the semiconductor die 100 above the edge termination region 106. The gate runner 138 electrically connects the gate pad 136 to the gate electrodes 132 of the transistor cells 110, outside the region of the source/emitter metallization 122.

The gate runner 138 is at gate potential. The gate electrodes 132 and the source/emitter regions 114 in the active region 104 of the semiconductor die 100 are at ground when the power transistor is off. The area below the gate runner 138 is depleted in the off state.

To improve Ron*AA without sacrificing breakdown voltage capability of the power transistor, the gate runner 138 is at least partly omitted along one or more sides S1, S2, S3, S4 of the semiconductor die 100 and a tungsten (W) runner 148 that follows the gate runner 138 and contacts the underside 150 of the gate runner 138 is present above the edge termination region 106 along each side S1 and/or S2 and/or S3 and/or S4 of the semiconductor die 100 that is at least partly devoid of the gate runner 138. Tungsten structures can be smaller than power metal features such as AlCu power metal features. Accordingly, the tungsten runner 148 can be made thinner and narrower than the gate runner 138 along each side Si and/or S2 and/or S3 and/or S4 of the semiconductor die 100 that is at least partly devoid of the gate runner 138.

Such a design improves Ron*AA without sacrificing breakdown voltage capability of the power transistor. In each region of the semiconductor die 100 where the tungsten runner 148 is present but the gate runner 138 is omitted, inactive semiconductor area may be converted to active semiconductor area for additional transistor cells 110 which effectively improves the Ron*AA FoM. For example, as shown in FIG. 2, the width of the edge termination 106 occupied by the gate runner 138 can be reduced from W1 to W2 along each side from which the gate runner 138 is omitted.

In one embodiment, the width W_GR of the gate runner 138 is greater than 10 μm and the width W_TR of the tungsten runner 148 along each side Si and/or S2 and/or S3 and/or S4 of the semiconductor die 100 that is devoid of the gate runner 138 is less than 10 μm. The tungsten runner 148 may be wider than the gate runner 138 along each side Si and/or S2 and/or S3 and/or S4 of the semiconductor die 100 that includes the gate runner 138, e.g., as shown in FIG. 2. The tungsten runner 148 also may be used to facilitate additional connections to the gate electrodes 132 of the transistor cells 110 in each region of the semiconductor die 100 where the gate runner 138 is not present. Accordingly, the tungsten runner 148 may be used to provide both an electrical connection to the gate electrodes 132 of the transistor cells 110 and a field plate effect, since in blocking state, the gate electrodes 132 are at ground potential. Even if the tungsten runner 148 is not used to provide an electrical connection to the gate electrodes 132 of the transistor cells 110, the tungsten runner 148 still helps to deplete the semiconductor substrate 100 below the tungsten runner 148 and therefore provides a contribution to the blocking capability of the edge termination region 106. Simulations show that the breakdown in the edge termination region 106 of the device shown in FIGS. 1 through 4 is (improved) higher by about 2V when the tungsten runner 148 is used as a field plate.

In FIG. 1, the side S2 of the semiconductor die 100 opposite the gate pad 136 is devoid of the gate runner 138 and the tungsten runner 148 is present above the edge termination region 106 along the side S2 of the semiconductor die 100 opposite the gate pad 136. In an embodiment, the gate runner 138 extends along three sides (e.g., S1, S3 and S4) of the semiconductor die 100 in a U-shape and the tungsten runner 148 extends along the side (e.g., S2) of the semiconductor die 100 that is devoid of the gate runner 138. The tungsten runner 148 also may extend along one or more of the sides (e.g., S1 and/or S3 and/or S4) of the semiconductor die 100 along which the gate runner 138 at least partly extends. In an embodiment, the tungsten runner 148 is present above the edge termination region 106 along each side S1, S2, S3, S4 of the semiconductor die 100.

Figure 5:
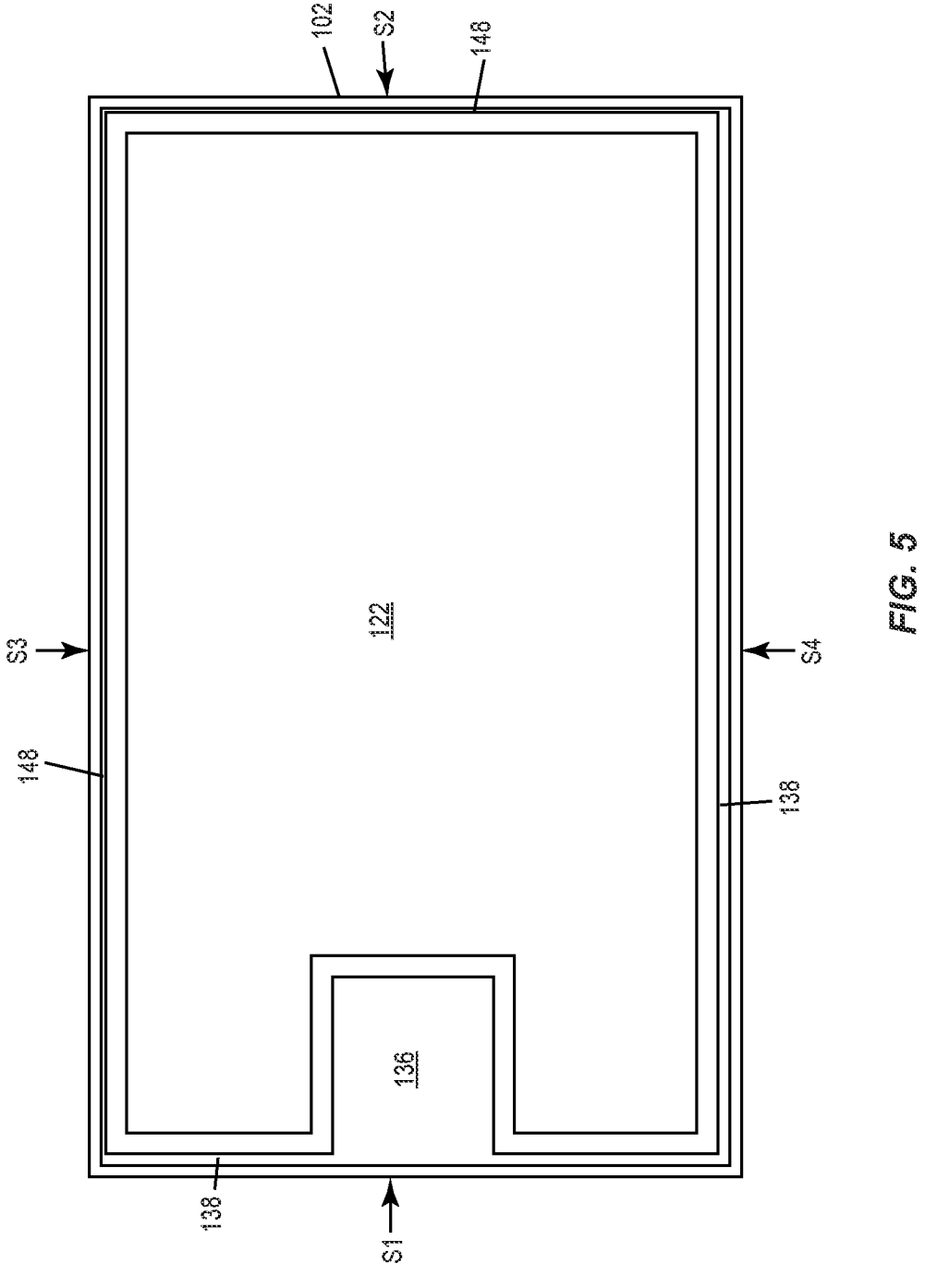
FIG. 5 illustrates a top plan view of the semiconductor die, according to another embodiment.

FIG. 5 illustrates a top plan view of the semiconductor die 100, according to another embodiment. In FIG. 5, the gate runner 138 extends along two of four sides (e.g., S1 and S4) of the semiconductor die 100 in an L-shape and the tungsten runner 148 extends along the other two sides (e.g., S2 and S3) of the semiconductor die 100. The tungsten runner 148 also may extend along one or both of the sides (e.g., S1 and/or S4) of the semiconductor die 100 along which the gate runner 138 extends.

Figure 6:
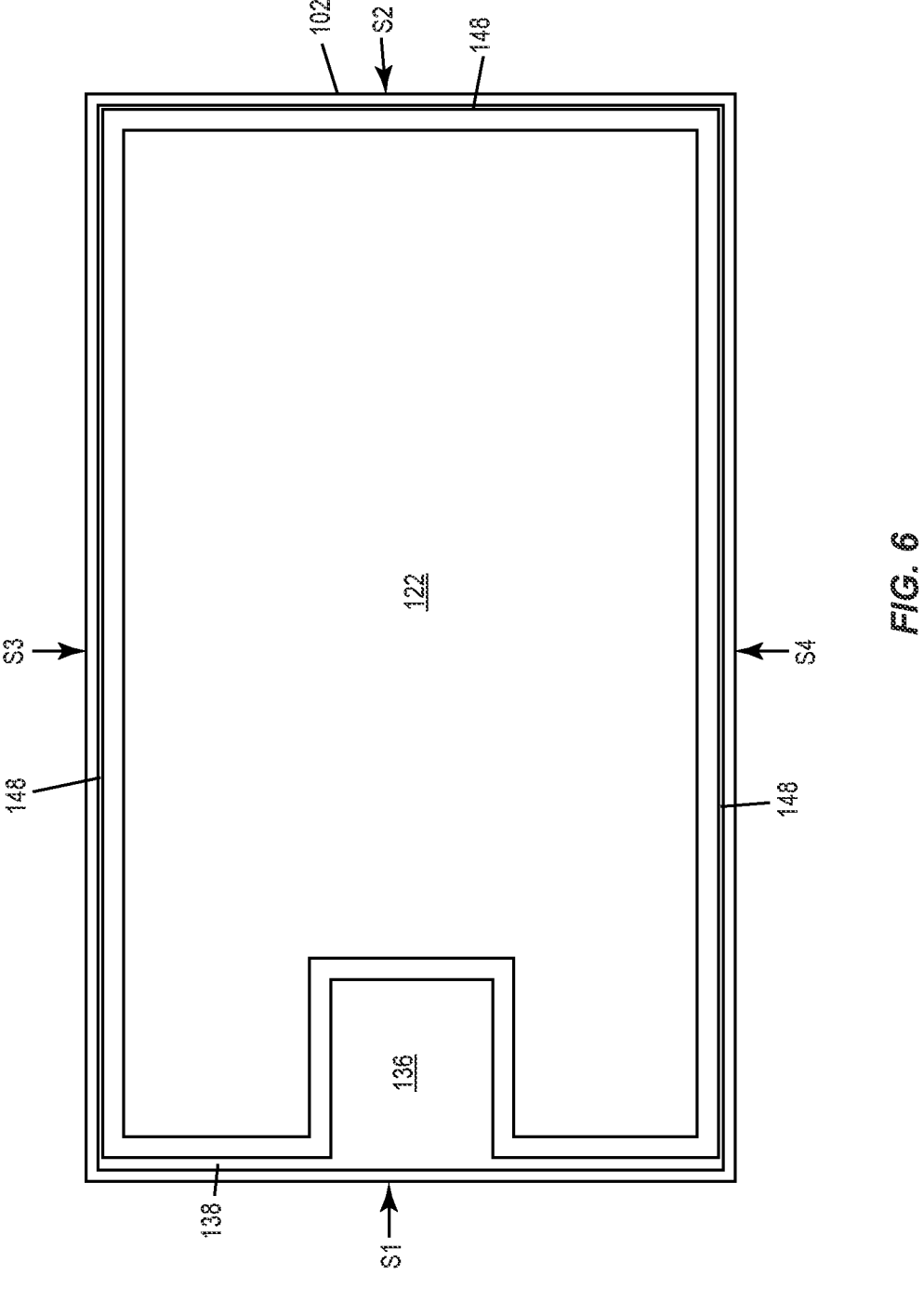
FIG. 6 illustrates a top plan view of the semiconductor die, according to another embodiment.

FIG. 6 illustrates a top plan view of the semiconductor die 100, according to another embodiment. In FIG. 6, the gate runner 138 extends along one of four sides (e.g., S1) of the semiconductor die 100 and the tungsten runner 148 extends along the other three sides (e.g., S2, S3, and S4) of the semiconductor die 100. The tungsten runner 148 also may extend along the side (e.g., S1) of the semiconductor die 100 along which the gate runner 138 extends.

Figure 7:
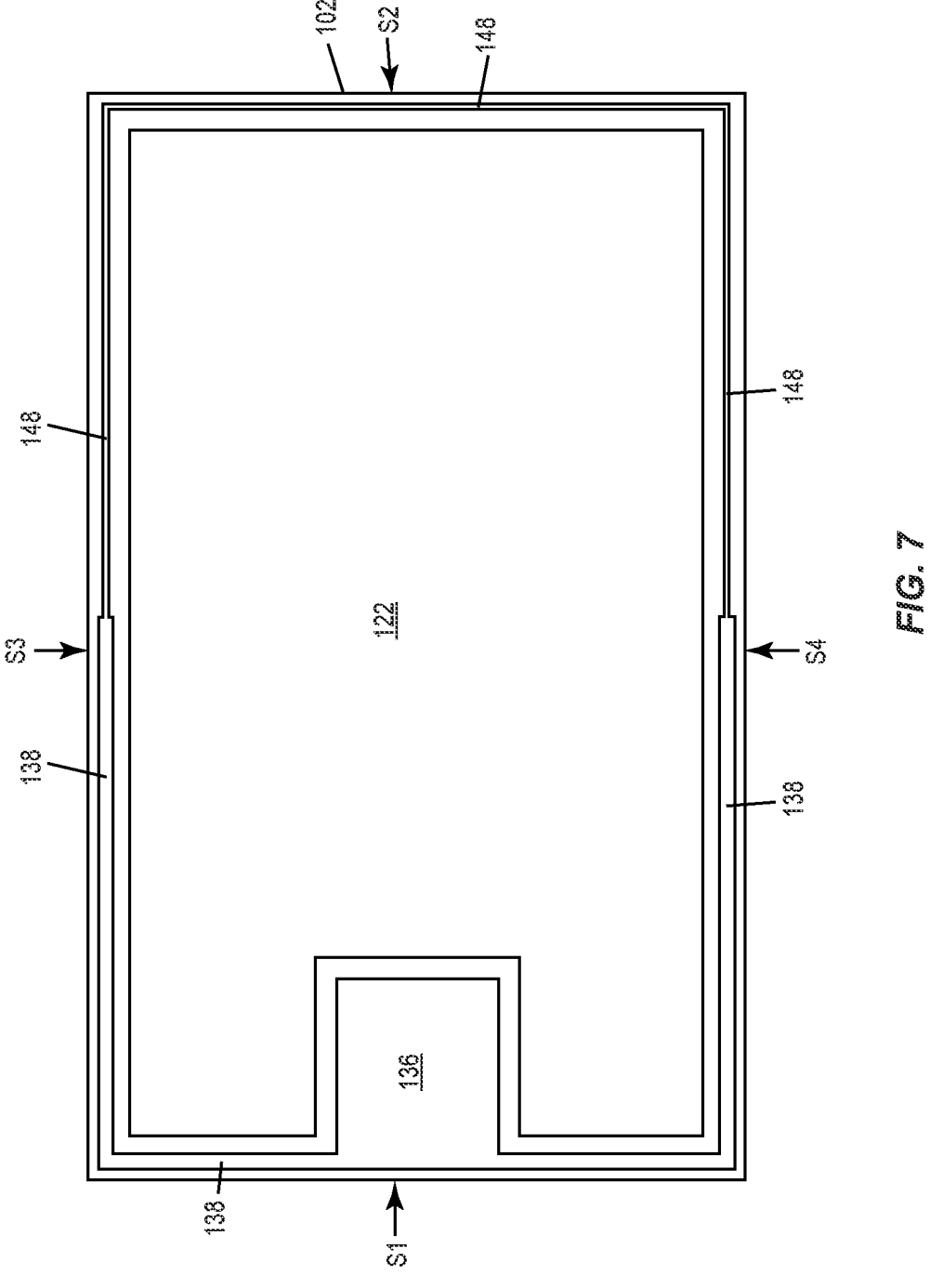
FIG. 7 illustrates a top plan view of the semiconductor die, according to another embodiment.

FIG. 7 illustrates a top plan view of the semiconductor die 100, according to another embodiment. In FIG. 7, the gate runner 138 extends along an entire first side of four sides (e.g., S1) of the semiconductor die 100 and partly along second and third sides of the four sides (e.g., S3 and S4) of the semiconductor die 100 in a U-shape and the tungsten runner 148 extends along the fourth side (e.g., S2) of the semiconductor die 100. The tungsten runner 148 also may extend along the first, second, and/or third side (e.g., Si and/or S2 and/or S3) of the semiconductor die 100 along which the gate runner 138 at least partly extends.

Returning to FIG. 2, the tungsten runner 148 may be part of a structured tungsten layer 152 disposed below the structured power metallization 140 in one or more outer corner areas of the edge termination region 106. One or more of the outer corner areas may include rows of field plate trenches 142 that are covered by a single field plate section 154 of the structured tungsten layer 152, e.g., as shown in the outer corner area illustrated in FIG. 2. The field plate trenches 142 may be needle-shaped in that the trenches 142 are narrow and long in a depth-wise direction (z direction in FIGS. 3 and 4) of the semiconductor substrate 102. Each single field plate 154 of the structured tungsten layer 152 is vertically connected to the field plate electrodes 144 included in one or more innermost rows of the needle-shaped field plate trenches 142 covered by the tungsten field plate 154. Accordingly, the field plate electrodes 144 included in at least the innermost row(s) or even all rows of the needle-shaped field plate trenches 142 may be vertically connected to the tungsten field plate 154 that covers the needle-shaped field plate trenches 142. In one embodiment, the field plate electrodes 144 included in at least an outermost row 155 of the needle-shaped field plate trenches 142 are disconnected from the single field plate 154 that covers the outermost row 155 and therefore electrically floating, where the outermost row 155 is the row of the needle-shaped field plate trenches 142 disposed closest to the edge 108 of the semiconductor substrate 102.

The rows of needle-shaped field plate trenches 142 may be electrically interconnected by tungsten fingers 156 of the structured tungsten layer 152 in one or more outer corner areas of the edge termination region 106. For example, the tungsten fingers 156 may be vertically aligned with and connected to the field plate electrodes 144 in the outer corner areas of the edge termination region 106.

There are no active channels or gate trenches in the outer corner areas of the edge termination region 106, so the spacing of the tungsten fingers 156 may be almost double as compared to in the active region 104 of the die 100. That is, there may two tungsten fingers 156 in the outer corner area for every one tungsten finger 156 that extends into the active region 104.

The single field plate section 154 of the structured tungsten layer 152 may be omitted such that the structured tungsten layer 152 includes just the tungsten fingers 156 above the rows of needle-shaped field plate trenches 142 in each outer corner area of the edge termination region 106. However, the field plate effect will be less in the area where the electric field is higher than compared to along the straight sides Si, S2, S3, S4 of the die 100, due to the increased field strength at the corners.

Because of the electric field curvature in the outer corner areas of the edge termination region 106, the effectiveness of the field plate effect may be increased relative to the straight edges S1, S2, S3, S4 of the die 100 by covering each outer corner area by the tungsten field plate 154. The tungsten field plate 154 may be implemented as a contiguous rectangular plate, since gate contacts are not required in the outer corner areas of the edge termination region 106. Accordingly, the field plate electrodes 144 in the outer corner areas of the edge termination region 106 may be contacted by the tungsten fingers 156 of the structured tungsten layer 152 without concern for the layout of the tungsten field plate 154.

As shown in FIG. 2, the structured tungsten layer 152 disposed below the structured power metallization 140 may include parallel tungsten field plates 158 disposed above the field plate trenches 142 outside the outer corner areas of the edge termination region 106. The field plate trenches 142 may be needle-shaped and include field plate electrodes 144, as explained above, and the parallel tungsten field plates 158 of the structured tungsten layer 152 may be vertically aligned with and connected to the field plate electrodes 144 outside the outer corner areas of the edge termination region 106.

Figure 8:
FIG. 8 illustrates a similar plan corner area view as FIG. 2, according to another embodiment.

FIG. 8 illustrates a similar plan outer corner area view as FIG. 2, according to another embodiment. In FIG. 8, and above the edge termination region 106, the structured tungsten layer 152 includes first fingers 160 longitudinally aligned with and vertically connected to the gate electrodes 132 of the transistor cells 110 and second fingers 156 interleaved with the first fingers 160 and vertically disconnected from the gate electrodes 132 of the transistor cells 110. The first fingers 160 and second fingers 156 of the structured tungsten layer 152 are also shown in FIG. 2. In the outer corner areas of the edge termination region 106, additional first fingers 164 are interleaved with the second fingers 156 but not vertically connected to any of the gate electrodes 132 of the transistor cells 110.

In an embodiment, the first fingers 160, 164 and the second fingers 162 of the structured tungsten layer 152 are spaced equidistantly. By equidistantly spacing the first fingers 160, 164 and the second fingers 162 of the structured tungsten layer 152, equidistant spacing is achieved in both the horizontal and vertical directions next to the outer corner area. Accordingly, the equipotential electric field lines in the semiconductor substrate 102 are substantially identical in the outer corner area, whether going into the vertical or horizontal direction. By including the oxide trench 145 in the edge termination region 106, the point of electrical breakdown is shifted from outside the edge termination region 106 inwards. To avoid breakdown from occurring in the corner of the outer body regions 116, the single/rectangular tungsten field plate section 154 may be included in the structured tungsten layer 152 which shifts the breakdown to the straight side of the die 100.

Separately or in combination, the gate electrodes 132 of the transistor cells 110 may be disposed in stripe-shaped trenches and the first fingers 160 of the structured tungsten layer 152 and which are located outside the outer corner areas of the edge termination region 106 may be vertically connected to the gate electrodes 132 at one or both ends of the stripe-shaped trenches 128. In the case of the stripe-shaped gate trenches 128, the first fingers 160, 164 and the second fingers 162 of the structured tungsten layer 152 may be spaced at half the distance as the gate electrodes 132, for example.

Figure 9:
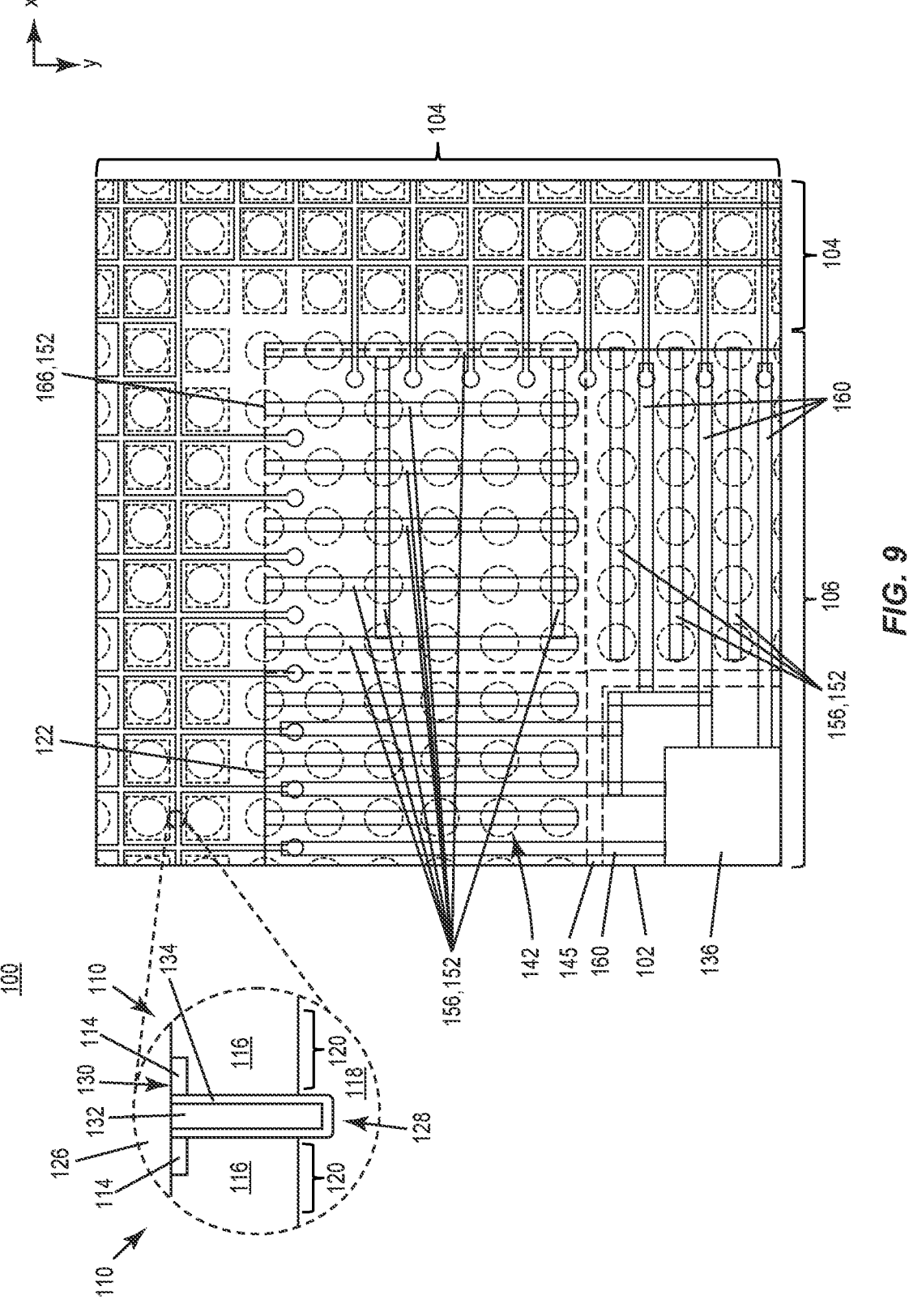
FIG. 9 illustrates a top plan view of an inner corner area of the semiconductor die indicated by the dashed square labeled II in FIG. 1.

FIG. 9 illustrates a top plan view of the inner corner area of the semiconductor die 100 indicated by the dashed square labeled II in FIG. 1. The inner corner area of the edge termination region 106 includes field plate trenches 142 that are covered by a single (tungsten) field plate section 166 of the structured tungsten layer 152. The tungsten field plate 166 may be implemented as a contiguous rectangular plate, since gate contacts are not required in the inner corner area of the edge termination region 106. The tungsten field plate 166 may merge with the source/emitter metallization 122 in this part of the semiconductor die 100. The field plate trenches 142 may be needle-shaped and the tungsten field plate 166 of the structured tungsten layer 152 may be vertically connected to the field plate electrodes 144 included in some or all of the needle-shaped field plate trenches 142 covered by the tungsten field plate 166.

Although the present disclosure is not so limited, the following numbered examples demonstrate one or more aspects of the disclosure.

Example 1. A semiconductor die, comprising: a semiconductor substrate comprising an active region and an edge termination region that separates the active region from an edge of the semiconductor substrate; a plurality of transistor cells formed in the active region; a structured power metallization above the semiconductor substrate and comprising a gate pad and a gate runner that extends from the gate pad along one or more but not all sides of the semiconductor die above the edge termination region, the gate runner electrically connecting the gate pad to gate electrodes of the transistor cells; and a tungsten runner that follows the gate runner and contacts an underside of the gate runner, wherein the tungsten runner is present above the edge termination region along each side of the semiconductor die that is at least partly devoid of the gate runner.

Example 2. The semiconductor die of example 1, wherein the tungsten runner is present above the edge termination region along each side of the semiconductor die.

Example 3. The semiconductor die of example 1, wherein the gate runner extends along three of four sides of the semiconductor die in a U-shape, and wherein the tungsten runner extends along the fourth side of the semiconductor die.

Example 4. The semiconductor die of example 1, wherein the gate runner extends along two of four sides of the semiconductor die in an L-shape, and wherein the tungsten runner extends along the other two sides of the semiconductor die.

Example 5. The semiconductor die of example 1, wherein the gate runner extends along one of four sides of the semiconductor die, and wherein the tungsten runner extends along the other three sides of the semiconductor die.

Example 6. The semiconductor die of example 1, wherein the gate runner extends along an entire first side of four sides of the semiconductor die and partly along second and third sides of the four sides of the semiconductor die in a U-shape, and wherein the tungsten runner extends along the fourth side of the semiconductor die.

Example 7. The semiconductor die of example 1, wherein a side of the semiconductor die opposite the gate pad is devoid of the gate runner, and wherein the tungsten runner is present above the edge termination region along the side of the semiconductor die opposite the gate pad.

Example 8. The semiconductor die of any of examples 1 through 7, wherein a width of the gate runner is greater than 10 μm, and wherein a width of the tungsten runner along each side of the semiconductor die that is devoid of the gate runner is less than 10 μm.

Example 9. The semiconductor die of any of examples 1 through 8, wherein the tungsten runner is wider than the gate runner along each side of the semiconductor die that includes the gate runner.

Example 10. The semiconductor die of any of examples 1 through 9, wherein the tungsten runner is part of a structured tungsten layer disposed below the structured power metallization, and wherein one or more outer corner areas of the edge termination region includes field plate trenches that are covered by a single field plate section of the structured tungsten layer.

Example 11. The semiconductor die of example 10, wherein the field plate trenches are needle-shaped, and wherein each single field plate of the structured tungsten layer is vertically connected to field plate electrodes included in one or more innermost rows of the needle-shaped field plate trenches covered by the single field plate.

Example 12. The semiconductor die of example 11, wherein the field plate electrodes included in at least an outermost row of the needle-shaped field plate trenches are disconnected from the single field plate that covers the outermost row.

Example 13. The semiconductor die of any of examples 1 through 9, wherein the tungsten runner is part of a structured tungsten layer disposed below the structured power metallization, and wherein the edge termination region includes field plate trenches above which parallel field plates of the structured tungsten layer are disposed.

Example 14. The semiconductor die of example 13, wherein the field plate trenches are needle-shaped and include field plate electrodes, and wherein the parallel field plates are vertically aligned with and connected to the field plate electrodes.

Example 15. The semiconductor die of any of examples 1 through 9, wherein the tungsten runner is part of a structured tungsten layer disposed below the structured power metallization, and wherein above the edge termination region, the structured tungsten layer comprises first fingers longitudinally aligned with and vertically connected to the gate electrodes of the transistor cells and second fingers interleaved with the first fingers and vertically disconnected from the gate electrodes of the transistor cells.

Example 16. The semiconductor die of example 15, wherein the first fingers and the second fingers are spaced equidistantly.

Example 17. The semiconductor die of example 15 or 16, wherein the gate electrodes of the transistor cells are disposed in stripe-shaped trenches, and wherein the first fingers are vertically connected to the gate electrodes at one or both ends of the stripe-shaped trenches.

Example 18. The semiconductor die of example 17, wherein the first fingers and the second fingers are spaced at half the distance as the gate electrodes.

Example 19. The semiconductor die of any of examples 1 through 18, wherein a power transistor formed by the plurality of transistor cells has a breakdown voltage of at least 150V.

Example 21. The semiconductor die of any of examples 1 through 19, wherein the tungsten runner is part of a structured tungsten layer disposed below the structured power metallization, and wherein one or more inner corner areas of the edge termination region includes field plate trenches that are covered by a single field plate section of the structured tungsten layer.

Example 20. A method of producing a semiconductor die, the method comprising: forming a plurality of transistor cells formed in an active region of a semiconductor substrate that also comprises an edge termination region that separates the active region from an edge of the semiconductor substrate; forming a structured power metallization above the semiconductor substrate, the structured power metallization comprising a gate pad and a gate runner that extends from the gate pad along one or more but not all sides of the semiconductor die above the edge termination region, the gate runner electrically connecting the gate pad to gate electrodes of the transistor cells; and forming a tungsten runner that follows the gate runner and is in contact with an underside of the gate runner, wherein the tungsten runner is present above the edge termination region along each side of the semiconductor die that is at least partly devoid of the gate runner.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor die, comprising:
a semiconductor substrate comprising an active region and an edge termination region that separates the active region from an edge of the semiconductor substrate;
a plurality of transistor cells formed in the active region;
a structured power metallization above the semiconductor substrate and comprising a gate pad and a gate runner that extends from the gate pad along one or more but not all sides of the semiconductor die above the edge termination region, the gate runner electrically connecting the gate pad to gate electrodes of the transistor cells; and
a tungsten runner that follows the gate runner and contacts an underside of the gate runner,
wherein the tungsten runner is present above the edge termination region along each side of the semiconductor die that is at least partly devoid of the gate runner,
wherein the tungsten runner is part of a structured tungsten layer disposed below the structured power metallization,
wherein the structured tungsten layer comprises a first part that forms the tungsten runner, and a second part laterally separated from the first part and that includes one or more tungsten structures disposed above the edge termination region.

2. The semiconductor die of claim 1, wherein the tungsten runner is present above the edge termination region along each side of the semiconductor die.

3. The semiconductor die of claim 1, wherein the gate runner extends along three of four sides of the semiconductor die in a U-shape, and wherein the tungsten runner extends along the fourth side of the semiconductor die.

4. The semiconductor die of claim 1, wherein the gate runner extends along two of four sides of the semiconductor die in an L-shape, and wherein the tungsten runner extends along the other two sides of the semiconductor die.

5. The semiconductor die of claim 1, wherein the gate runner extends along one of four sides of the semiconductor die, and wherein the tungsten runner extends along the other three sides of the semiconductor die.

6. The semiconductor die of claim 1, wherein the gate runner extends along an entire first side of four sides of the semiconductor die and partly along second and third sides of the four sides of the semiconductor die in a U-shape, and wherein the tungsten runner extends along the fourth side of the semiconductor die.

7. The semiconductor die of claim 1, wherein a side of the semiconductor die opposite the gate pad is devoid of the gate runner, and wherein the tungsten runner is present above the edge termination region along the side of the semiconductor die opposite the gate pad.

8. The semiconductor die of claim 1, wherein a width of the gate runner is greater than 10 µm, and wherein a width of the tungsten runner along each side of the semiconductor die that is devoid of the gate runner is less than 10 µm.

9. The semiconductor die of claim 1, wherein the tungsten runner is wider than the gate runner along each side of the semiconductor die that includes the gate runner.

10. The semiconductor die of claim 1, wherein one or more outer corner areas of the edge termination region includes field plate trenches that are covered by a single field plate section of the second part of the structured tungsten layer.

11. The semiconductor die of claim 10, wherein the field plate trenches are needle-shaped, and wherein each single field plate of the structured tungsten layer is vertically connected to field plate electrodes included in one or more innermost rows of the needle-shaped field plate trenches covered by the single field plate.

12. The semiconductor die of claim 11, wherein the field plate electrodes included in at least an outermost row of the needle-shaped field plate trenches are disconnected from the single field plate that covers the outermost row.

13. The semiconductor die of claim 1, wherein the edge termination region includes field plate trenches above which parallel field plates of the second part of the structured tungsten layer are disposed.

14. The semiconductor die of claim 13, wherein the field plate trenches are needle-shaped and include field plate electrodes, and wherein the parallel field plates are vertically aligned with and connected to the field plate electrodes.

15. The semiconductor die of claim 1, wherein above the edge termination region, the second part of the structured tungsten layer comprises first fingers longitudinally aligned with and vertically connected to the gate electrodes of the transistor cells and second fingers interleaved with the first fingers and vertically disconnected from the gate electrodes of the transistor cells.

16. The semiconductor die of claim 15, wherein the first fingers and the second fingers are spaced equidistantly.

17. The semiconductor die of claim 15, wherein the gate electrodes of the transistor cells are disposed in stripe-shaped trenches, and wherein the first fingers are vertically connected to the gate electrodes at one or both ends of the stripe-shaped trenches.

18. The semiconductor die of claim 17, wherein the first fingers and the second fingers are spaced at half the distance as the gate electrodes.

19. The semiconductor die of claim 1, wherein a power transistor formed by the plurality of transistor cells has a breakdown voltage of at least 150V.

20. The semiconductor die of claim 1, wherein one or more inner corner areas of the edge termination region includes field plate trenches that are covered by a single field plate section of the second part of the structured tungsten layer.

21. A method of producing a semiconductor die, the method comprising:
forming a plurality of transistor cells formed in an active region of a semiconductor substrate that also comprises an edge termination region that separates the active region from an edge of the semiconductor substrate;
forming a structured power metallization above the semiconductor substrate, the structured power metallization comprising a gate pad and a gate runner that extends from the gate pad along one or more but not all sides of the semiconductor die above the edge termination region, the gate runner electrically connecting the gate pad to gate electrodes of the transistor cells; and
forming a tungsten runner that follows the gate runner and is in contact with an underside of the gate runner,
wherein the tungsten runner is present above the edge termination region along each side of the semiconductor die that is at least partly devoid of the gate runner,
wherein forming the tungsten runner comprises forming a structured tungsten layer below the structured power metallization, the structured tungsten layer comprising a first part that forms the tungsten runner, and a second part laterally separated from the first part and that includes one or more tungsten structures disposed above the edge termination region.

22. A semiconductor die, comprising:
a semiconductor substrate comprising an active region and an edge termination region that separates the active region from an edge of the semiconductor substrate;
a plurality of transistor cells formed in the active region;
a structured power metallization above the semiconductor substrate and comprising a gate pad and a gate runner that extends from the gate pad along one or more but not all sides of the semiconductor die above the edge termination region, the gate runner electrically connecting the gate pad to gate electrodes of the transistor cells; and
a tungsten runner that follows the gate runner and contacts an underside of the gate runner,
wherein the tungsten runner is present above the edge termination region along each side of the semiconductor die that is at least partly devoid of the gate runner,
wherein the gate runner is omitted along an entire side of the semiconductor die,
wherein the tungsten runner is present above the edge termination region along the entire side of the semiconductor die from which the gate runner is omitted,
wherein the tungsten runner has a width along the entire side of the semiconductor die from which the gate runner is omitted that is less than a width of the gate runner.

23. The semiconductor die of claim 22, wherein a width of the edge termination region occupied by the gate runner is reduced along the entire side of the semiconductor die from which the gate runner is omitted.

24. The semiconductor die of claim 22, wherein the entire side of the semiconductor die from which the gate runner is omitted is spaced apart from the gate pad.

* * * * *